(12) United States Patent
Son (10) Patent No.: US 8,310,045 B2
(45) Date of Patent: Nov. 13, 2012

(54) SEMICONDUCTOR PACKAGE WITH HEAT DISSIPATION DEVICES

(75) Inventor: Ho Young Son, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 61 days.

(21) Appl. No.: 13/012,877

(22) Filed: Jan. 25, 2011

(65) Prior Publication Data

US 2011/0304036 A1   Dec. 15, 2011

(30) Foreign Application Priority Data

Jun. 9, 2010   (KR) .................. 10-2010-0054413

(51) Int. Cl.
*H01L 23/48* (2006.01)

(52) U.S. Cl. ........ 257/712; 257/621; 257/686; 257/713; 257/720; 257/777; 257/E23.083; 257/E23.085; 257/E23.101; 257/E25.013; 257/E25.018; 257/E25.027

(58) Field of Classification Search .................. 257/621, 257/686, 777, 712, 713, 720, E23.083, E23.085, 257/E23.101, E25.013, E25.018, E25.027
See application file for complete search history.

(56) References Cited

U.S. PATENT DOCUMENTS

| | | | |
|---|---|---|---|
| 5,325,265 A * | 6/1994 | Turlik et al. .................. 361/702 |
| 2005/0184399 A1 * | 8/2005 | Damberg et al. ............. 257/777 |
| 2007/0097650 A1 * | 5/2007 | Fitzgerald et al. ............ 361/704 |

* cited by examiner

*Primary Examiner* — Peniel M Gumedzoe
(74) *Attorney, Agent, or Firm* — William Park & Associates Ltd.

(57) ABSTRACT

A semiconductor package includes a first semiconductor chip having a first surface and a second surface which faces away from the first surface, a heat dissipation member, defined with a cavity, disposed on the first surface of the first semiconductor chip and having a plurality of metal pillars which contact the first semiconductor chip, and one or more second semiconductor chips stacked on the first surface of the first semiconductor chip in the cavity to be electrically connected with one another and with the first semiconductor chip.

20 Claims, 10 Drawing Sheets

SEMICONDUCTOR PACKAGE WITH HEAT DISSIPATION DEVICES

CROSS-REFERENCE TO RELATED APPLICATIONS

The present application claims priority to Korean patent application number 10-2010-0054413 filed on Jun. 9, 2010, which is incorporated herein by reference in its entirety.

BACKGROUND OF THE INVENTION

The present invention relates to a semiconductor package, and more particularly, to a semiconductor package which can improve a heat dissipation characteristic and achieve an improved operation characteristic.

These days, the electronic industry trends to manufacture products at reduced costs with high reliability in such a way as to accomplish light weight, miniaturization, high speed operation, multi-functionality, and high performance. A package assembly technology is important for achieving such purposes. The package assembly technology protects memory chips, having integrated circuits formed therein through a wafer fabrication process, and allows those chips to be easily mounted to a substrate so that operational reliability of the memory chips can be secured.

As the electronic industry trends toward light weight, miniaturization, high speed operation, multi-functionality, and high performance, the number of input/output terminals and the operation speed of a semiconductor package have considerably increased, whereas the size of the semiconductor package has markedly decreased.

Hence, as power consumption per unit volume increases, heat generated during the operation of a memory chip raises the temperature of a package. Such a temperature rise results in a decrease in the operation speed of a semiconductor package. Thus, it is important to dissipate the heat generated during the operation of the memory chip.

However, since a conventional semiconductor package has a structure in which a memory chip is smaller than a substrate it is mounted on, a problem is that it is not easy to dissipate heat from a portion of the substrate where the memory chip is not disposed.

In particular, since the portion of the substrate where the memory chip is not disposed is sealed by a substance with poor heat conductivity, such as an EMC (epoxy molding compound), so as to protect the package, the portion of the substrate is not likely to appropriately dissipate a large amount of heat generated during operation of the memory chip. Consequently, in the conventional semiconductor package, since it is not easy to dissipate the heat generated during the operation of the memory chip, the temperature of the package rises and the operation characteristic of the package may deteriorate.

BRIEF SUMMARY OF THE INVENTION

An embodiment of the present invention is directed to a semiconductor package which can improve a heat dissipation characteristic.

Also, an embodiment of the present invention is directed to a semiconductor package which can achieve an improved operation characteristic.

In one embodiment of the present invention, a semiconductor package includes: a first semiconductor chip having a first surface and a second surface which faces away from the first surface, a heat dissipation member, defined with a cavity, disposed on the first surface of the first semiconductor chip and having a plurality of metal pillars which contact the first semiconductor chip, and one or more second semiconductor chips stacked on the first surface of the first semiconductor chip in the cavity to be electrically connected with one another and with the first semiconductor chip.

The first semiconductor chip may be a logic chip or a memory chip.

The heat dissipation member may be formed of a ceramic material.

The metal pillars may be formed of any one of copper (Cu), gold (Au), aluminum (Al), and silver (Ag) or an alloy including at least one thereof.

At least one of the plurality of metal pillars may have a shape which is bent toward a side surface of the heat dissipation member.

The semiconductor package may further include a metal layer pattern formed on the side surface of the heat dissipation member to contact the metal pillar with the bent shape among the plurality of metal pillars.

The semiconductor package may further include metal line patterns installed in the heat dissipation member and extending among the plurality of metal pillars in a direction perpendicular to the metal pillars.

The semiconductor package may further include a metal layer pattern formed on the side surface of the heat dissipation member in such a way as to contact the metal line patterns.

The semiconductor package may further include a metal layer pattern formed on an upper surface of the heat dissipation member in such a way as to contact the metal pillars.

The semiconductor package may further include a plurality of additional metal pillars installed in the heat dissipation member over the cavity.

The semiconductor package may further include a metal layer pattern formed on the upper surface of the heat dissipation member in such a way as to contact the additional metal pillars.

The semiconductor package may further include a metal layer pattern formed in the heat dissipation member over the cavity in such a way as to contact the additional metal pillars.

The semiconductor package may further include a metal layer pattern formed over the first semiconductor chip in such a way as to contact the metal pillars.

The semiconductor package may further include a TIM (thermal interface material) formed on a surface portion of the heat dissipation member over the cavity.

The semiconductor package may further include a TIM formed on portions of the first surface of the first semiconductor chip, which contact the plurality of metal pillars.

The semiconductor package may further include a substrate having an upper surface and a lower surface, the first semiconductor chip including the heat dissipation member and the second semiconductor chips being mounted to the upper surface of the substrate, and external mounting members attached to the lower surface of the substrate.

The semiconductor package may further include an encapsulation member sealing the upper surface of the substrate including the heat dissipation member and the first semiconductor chip.

The semiconductor package may further include connection members interposed between the upper surface of the substrate and the first semiconductor chip.

The semiconductor package may further include pads disposed on the other surface of the first semiconductor chip, redistribution lines formed to be connected with the pads, and external connection terminals attached to the redistribution lines.

The semiconductor package may further include an insulation layer formed on the other surface of the first semiconductor chip in such a way as to expose at least portions of the redistribution lines.

DESCRIPTION OF SPECIFIC EMBODIMENTS

In the present invention, a heat dissipation member, which defines a cavity and has metal pillars installed around the cavity, is disposed on a first semiconductor chip, and a plurality of second semiconductor chips are mounted to the first surface of the first semiconductor chip in the cavity. As a consequence, in the present invention, even when the second semiconductor chips are smaller than the first semiconductor chip, it is possible to dissipate heat, generated during operation of the chips, through the metal pillars to an outside. Accordingly, in the present invention, the heat dissipation characteristic of a semiconductor package can be improved through the metal pillars, whereby the improved operation characteristic of the semiconductor package can be achieved.

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
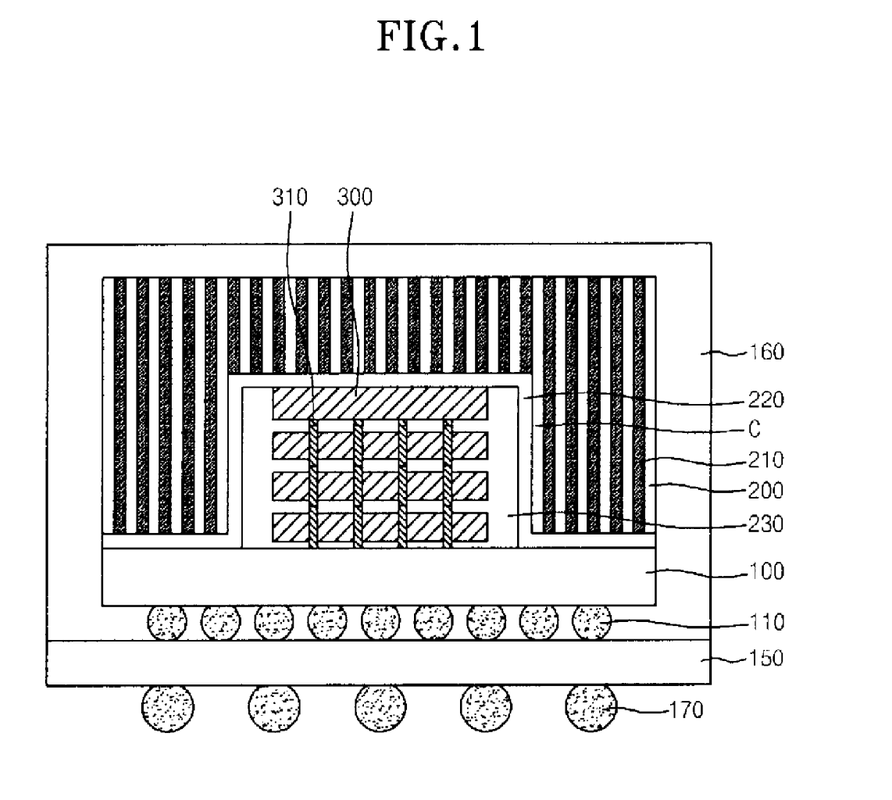
FIG. 1 is a cross-sectional view illustrating a semiconductor package in accordance with a first embodiment of the present invention.

FIG. 1 is a cross-sectional view illustrating a semiconductor package in accordance with a first embodiment of the present invention.

Referring to FIG. 1, a first semiconductor chip 100, on which second semiconductor chips 300 and a heat dissipation member 200 are disposed, is mounted to an upper surface of a substrate 150, which has the upper surface and a lower surface facing away from the upper surface, by the medium of connection members 110. The first semiconductor chip 100 may be a logic chip or a memory chip.

In detail, the first semiconductor chip 100 has a first surface and a second surface which faces away from the first surface. The heat dissipation member 200, which is formed of a ceramic material such as, for example, silicon or glass, is disposed over the first surface of the first semiconductor chip 100. The heat dissipation member 200 has a cavity C, and a plurality of metal pillars 210 are installed in the heat dissipation member 200 around the cavity C, that is, on both sides of the cavity C. In the present embodiment of the invention, the metal pillars 210 are additionally formed in the heat dissipation member 200 over the cavity C.

While the metal pillars 210 are described as being on both sides of the cavity C with respect to the 2-dimensional drawing in FIG. 1, the invention need not be so limited. The metal pillars 210 may be on all sides of the cavity C as needed, and where there is room. For example, if a top view shows the cavity C as a smaller square within a larger square that is the first semiconductor chip 100, the metal pillars 210 may be on all sides of the cavity C may be present on all four sides around the cavity C. Accordingly, with respect to FIG. 1 and other figures, the metal pillar 210 may be present as room is present and as the metal pillars 210 may be needed.

The metal pillars 210 are installed to be disposed over portions of the first semiconductor chip 100 by the medium of a TIM (thermal interface material) 220 on both sides of the second semiconductor chips 300. The metal pillars 210 are formed of, for example, any one of copper (Cu), gold (Au), aluminum (Al), and silver (Ag) with excellent heat conductivity or an alloy including at least one of copper (Cu), gold (Au), aluminum (Al), and silver (Ag).

The TIM 220 may be formed on the portions of the first semiconductor chip 100 which are to contact the metal pillars 210. Further, the TIM 220 may be formed over the cavity C which is defined in the heat dissipation member 200. The TIM 220 functions to block electrical connection between the metal pillars 210 and the first and second semiconductor chips 100 and 300, and serves as an adhesive.

One or more second semiconductor chips 300 are stacked on the first semiconductor chip 100 in the cavity C around which the TIM 220 is formed. The second semiconductor chips 300 are electrically connected with one another, for example, by way of through electrodes 310 and are electrically connected with the first semiconductor chip 100. An underfill member 230 is formed between the TIM 220 and the second semiconductor chips 300 and between the stacked second semiconductor chips 300 in such a way as to fill the space in the cavity C.

An encapsulation member 160 is formed to seal the upper surface of the substrate 150 including the second semiconductor chips 300, the heat dissipation member 200, and the first semiconductor chip 100. External mounting members 170 are formed on the lower surface of the substrate 150.

In an embodiment of the present invention, due to the fact that the metal pillars 210 are installed around the cavity C to be disposed over the portions of the first semiconductor chip 100 on both sides of the second semiconductor chips 300, the heat generated during operations of the first and second semiconductor chips 100 and 300 can be dissipated to an outside through the metal pillars 210. As a consequence, in an embodiment of the present invention, the heat dissipation characteristic of a semiconductor package can be improved, whereby the improved operation characteristic of the semiconductor package can be achieved.

FIGS. 2A through 2G are cross-sectional views illustrating the processes of a method for manufacturing the semiconductor package in accordance with the first embodiment of the present invention.

Figure 2A:
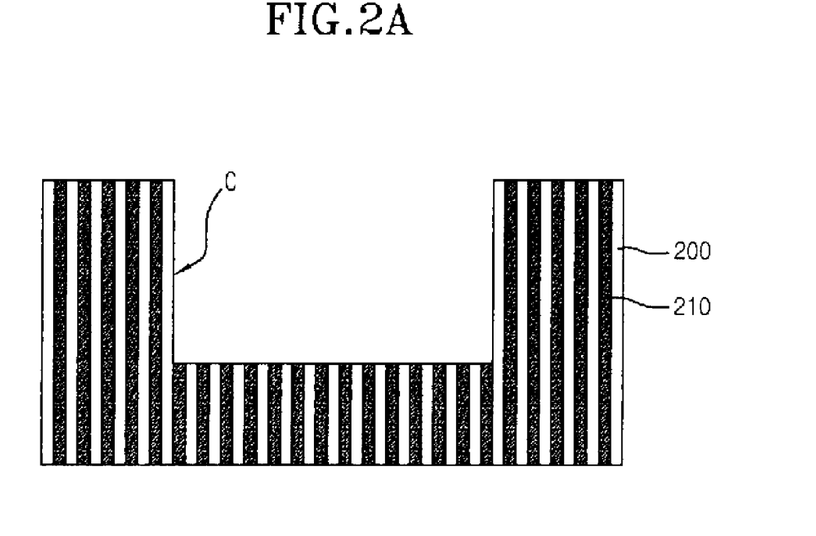
FIGS. 2A through 2G are cross-sectional views illustrating the processes of a method for manufacturing the semiconductor package in accordance with the first embodiment of the present invention.

Referring to FIG. 2A, a heat dissipation member 200, which has a cavity C and in which a plurality of metal pillars 210 are installed around the cavity C, for example, on both sides of the cavity C, is prepared. In an embodiment of the present invention, metal pillars 210 are additionally installed in the heat dissipation member 200 over the cavity C.

The heat dissipation member 200 is formed of a ceramic material such as, for example, silicon, or glass. The metal pillars 210 are formed of, for example, any one of copper (Cu), gold (Au), aluminum (Al), and silver (Ag) with excellent heat conductivity or an alloy including at least one of copper (Cu), gold (Au), aluminum (Al) and silver (Ag).

Figure 2B:
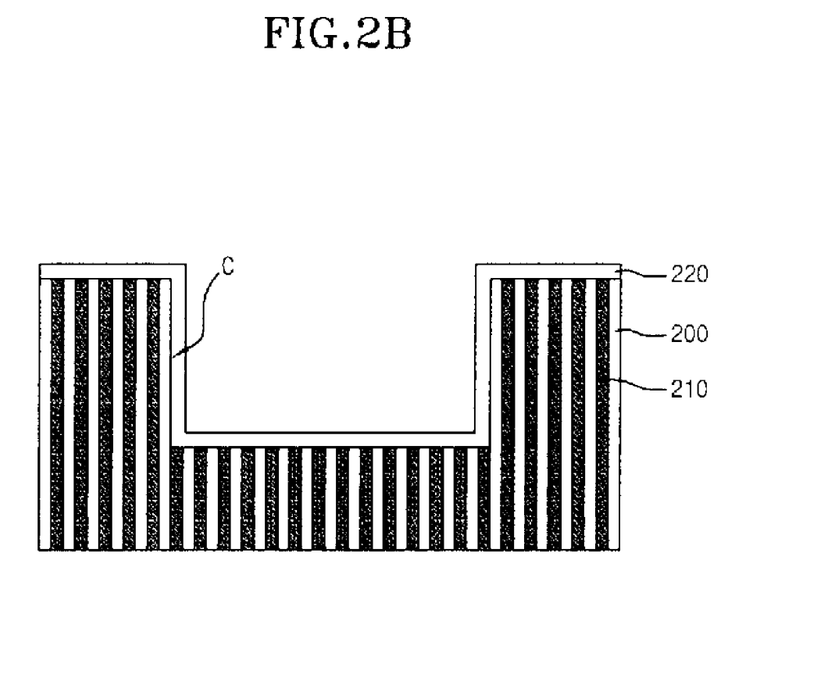

Referring to FIG. 2B, a TIM 220 is formed on the surface of the heat dissipation member 200 including the cavity C. The TIM 220 functions to block electrical connection between the metal pillars 210 and first and second semiconductor chips 100 and 300, and can serve as an adhesive. The TIM 220 is partially removed such that the TIM 220 remains only on the inner walls of the cavity C and the surface of the heat dissipation member 200 on both sides of the cavity C.

Figure 2C:
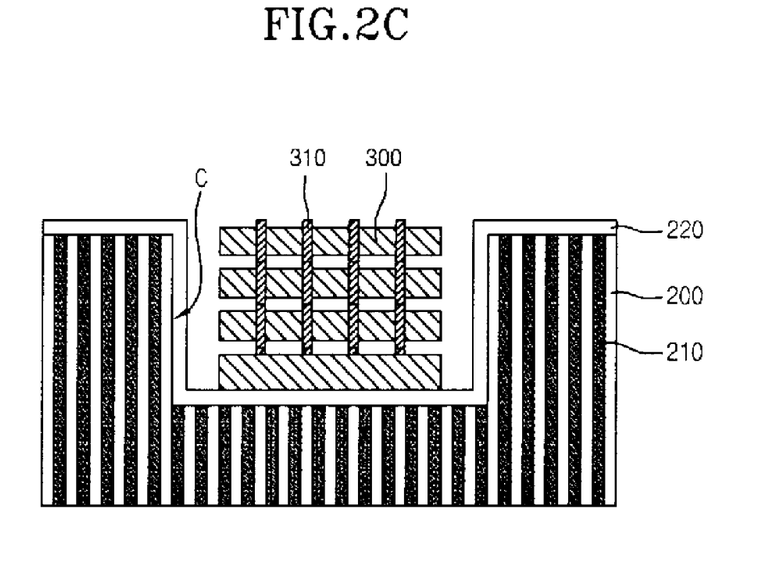

Referring to FIG. 2C, one or more second semiconductor chips 330 are stacked in the cavity C of the heat dissipation member 200 on which the TIM 220 is formed. The second semiconductor chips 300 are stacked to be electrically connected with one another. For example, the second semiconductor chips 300 are stacked to be electrically connected with one another by way of through electrodes 310.

Figure 2D:
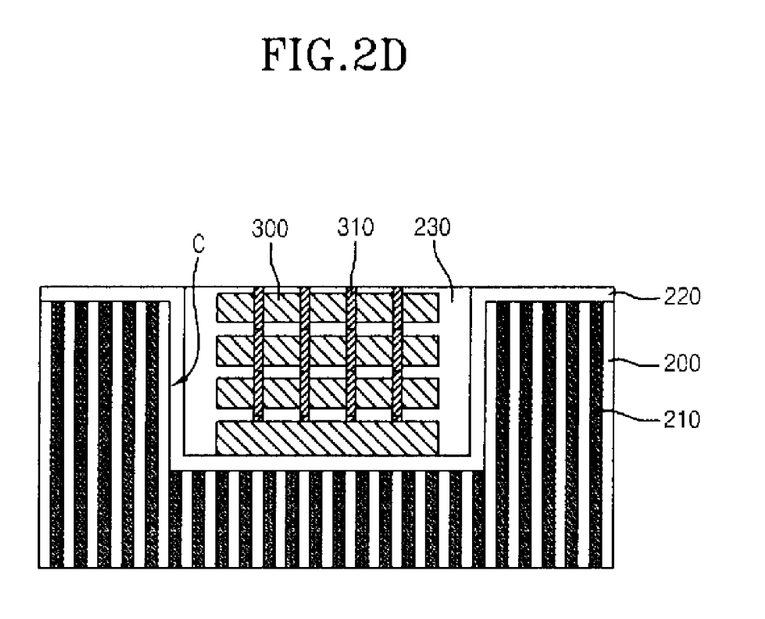

Referring to FIG. 2D, an underfill member 230 is formed in the cavity C where the second semiconductor chips 300 are stacked, in such a way as to fill spaces between the inner walls of the cavity C and the second semiconductor chips 300 and between the stacked second semiconductor chips 300. After the underfill member 230 is formed, the portion of the underfill member 230 which is formed over the TIM 220 on both sides of the cavity C is removed.

Figure 2E:
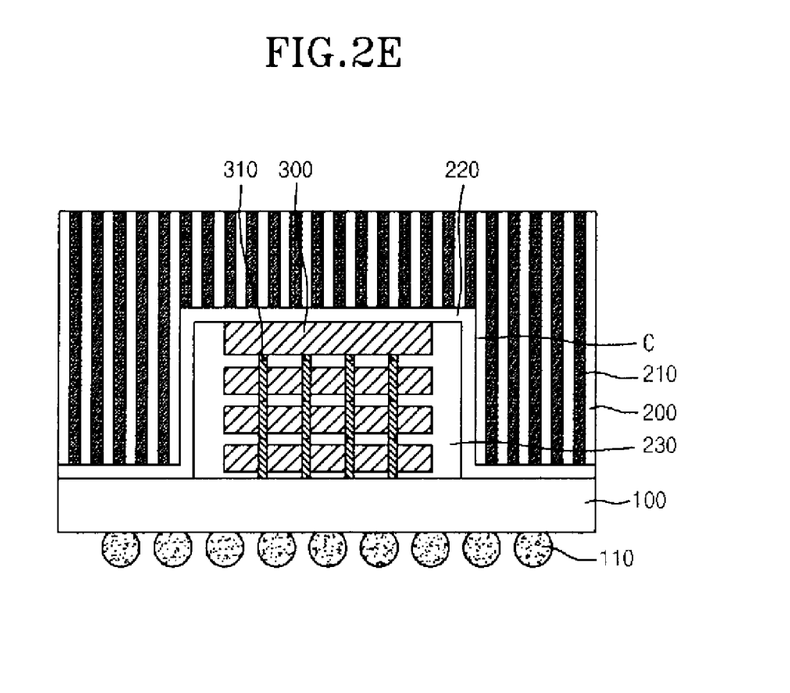

Referring to FIG. 2E, the heat dissipation member 200 with the second semiconductor chips 300 stacked in the cavity C is mounted to the first surface of the first semiconductor chip 100 which has the first surface and the second surface facing away from the first surface. The first semiconductor chip 100 may be a logic chip or a memory chip.

The second semiconductor chips 300 are mounted to be electrically connected with the first semiconductor chip 100, and the metal pillars 210 on both sides of the cavity C are disposed with the TIM 220 interposed between the metal pillars 210 and the first surface of the first semiconductor chip 100. Then, connection members 110 are formed on the second surface of the first semiconductor chip 100.

Figure 2F:
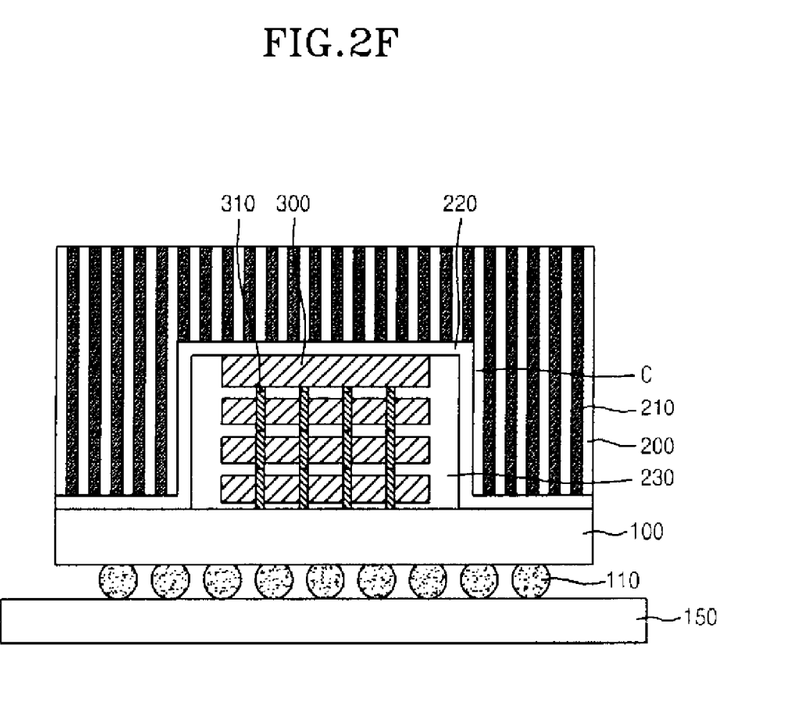

Referring to FIG. 2F, the first semiconductor chip 110 having the second semiconductor chips 300 and the heat dissipation member 200 disposed thereon is mounted to the upper surface of the substrate 150 and a lower surface. The first semiconductor chip 110 having the second semiconductor chips 300 and the heat dissipation member 200 disposed thereon is mounted to the upper surface of the substrate 150 by the medium of the connection members 110 which are formed on the second surface of the first semiconductor chip 100.

Figure 2G:
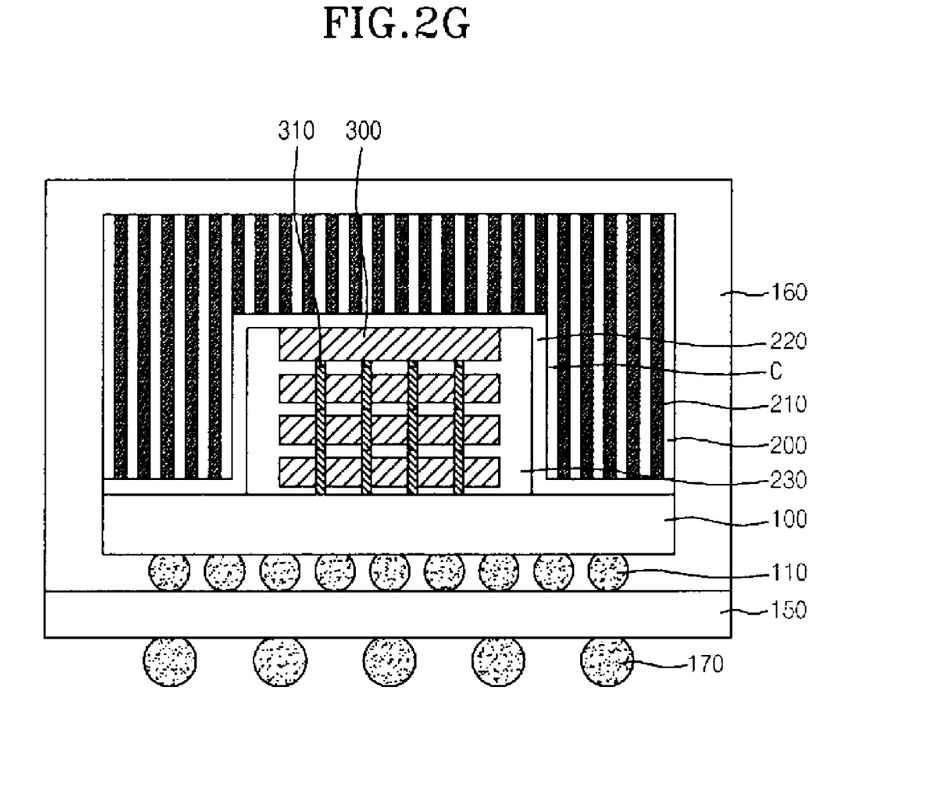

Referring to FIG. 2G, external mounting members 170 are formed on the lower surface of the substrate 150. An encapsulation member 160 is formed to seal the upper surface of the substrate 150 including the heat dissipation member 200 and the first semiconductor chip 100.

Thereafter, while not shown in a drawing, by sequentially performing a series of subsequent well-known processes, the manufacture of a semiconductor package in accordance with an embodiment of the present invention is completed.

As is apparent from the above descriptions, in an embodiment of the present invention, a heat dissipation member, which has a cavity and metal pillars arranged around the cavity, is disposed on a first surface of a first semiconductor chip such that the metal pillars substantially contact the first semiconductor chip, and second semiconductor chips are stacked on the first semiconductor chip in the cavity.

As a consequence, in an embodiment of the present invention, the heat generated during operations of the first and second semiconductor chips can be dissipated through the metal pillars to an outside. Therefore, in an embodiment of the present invention, the heat dissipation characteristic of a semiconductor package can be improved, whereby the improved operation characteristic of the semiconductor package can be achieved.

Meanwhile, although it was described and illustrated in the above embodiment that the first semiconductor chip with the second semiconductor chips and the heat dissipation member disposed thereon is mounted to the substrate by the medium of the connection members, in a second embodiment of the present invention, external connection terminals may be directly disposed on distribution lines which are formed on the second surface of a first semiconductor chip without using a substrate.

Figure 3:
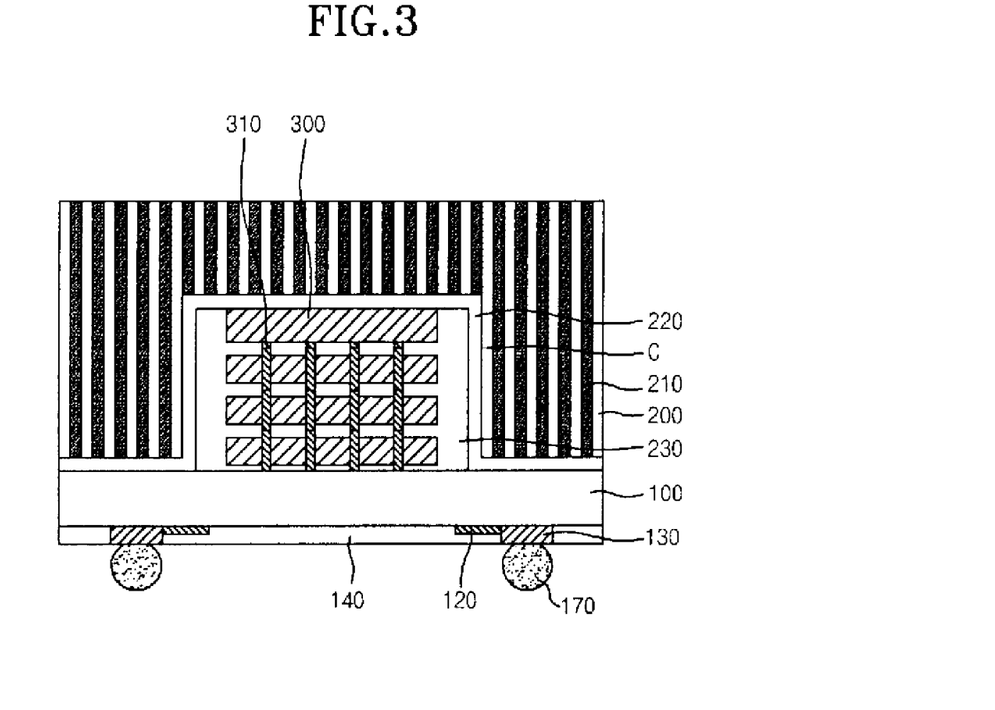
FIG. 3 is a cross-sectional view illustrating a semiconductor package in accordance with a second embodiment of the present invention.

FIG. 3 is a cross-sectional view illustrating a semiconductor package in accordance with a second embodiment of the present invention.

Referring to FIG. 3, redistribution pads 120 are disposed on the second surface of a first semiconductor chip 100 on which second semiconductor chips 300 and a heat dissipation member 200 are disposed. Redistribution lines 130 are formed to be electrically connected with the redistribution pads 120, and an insulation layer 140 is formed on the second surface of the first semiconductor chip 100 while exposing at least portions of the redistribution lines 130. External connection terminals 170 are attached to the exposed portions of the redistribution lines 130.

Although it was described and illustrated in the aforementioned embodiments that the heat dissipation member is formed such that the metal pillars are installed not only on both sides of the cavity but also over the cavity to dissipate heat from both sides and over the second semiconductor chips, it can be envisaged in a third embodiment of the present invention that metal pillars are not additionally installed over the second semiconductor chips since heat can be relatively easily dissipated and are installed only on both sides of the second semiconductor chips since heat cannot be easily dissipated, so that the height of a semiconductor package can be decreased.

Figure 4:
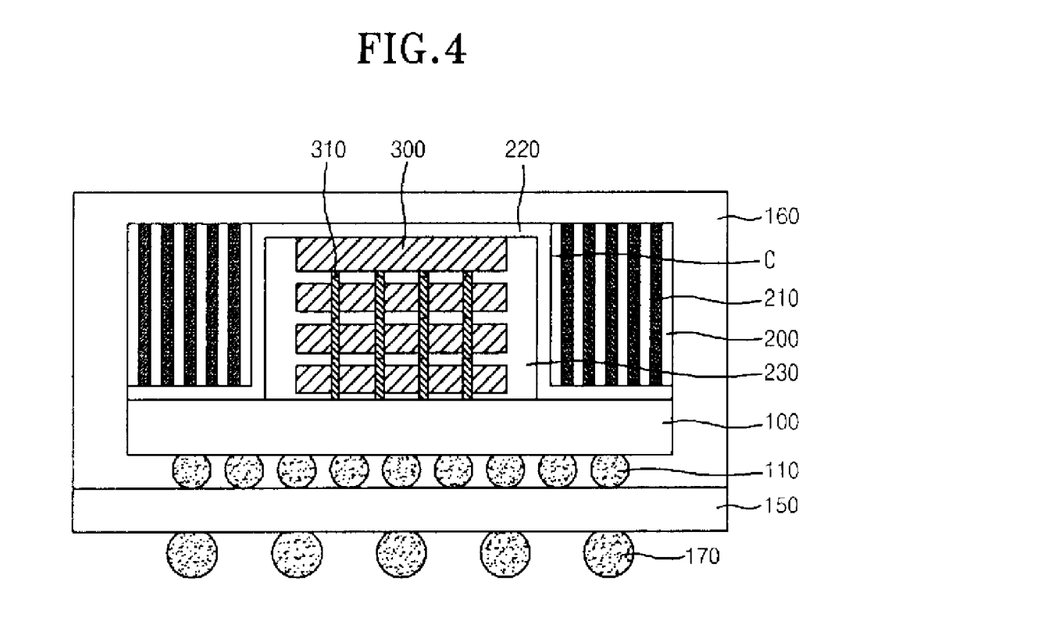
FIG. 4 is a cross-sectional view illustrating a semiconductor package in accordance with a third embodiment of the present invention.

FIG. 4 is a cross-sectional view illustrating a semiconductor package in accordance with a third embodiment of the present invention.

Referring to FIG. 4, a first semiconductor chip 100, on which second semiconductor chips 300 and a heat dissipation member 200 are disposed, is mounted to an upper surface of a substrate 150, which has an upper surface and a lower surface, by the medium of connection members 110. The first semiconductor chip 100 may be a logic chip or a memory chip.

In detail, the first semiconductor chip 100 has a first surface and a second surface which faces away from the first surface. The heat dissipation member 200, which is formed of a ceramic material such as, for example, silicon or glass, is disposed over the first surface of the first semiconductor chip 100. The heat dissipation member 200 has a cavity C, and a plurality of metal pillars 210 are installed in the heat dissipation member 200 on both sides of the cavity C.

The metal pillars 210 are installed to be disposed over portions of the first semiconductor chip 100 by the medium of a TIM (thermal interface material) 220 on both sides of the second semiconductor chips 300. The metal pillars 210 are formed of, for example, any one of copper (Cu), gold (Au), aluminum (Al), and silver (Ag) with excellent heat conductivity or an alloy including at least one of copper (Cu), gold (Au), aluminum (Al), and silver (Ag).

One or more second semiconductor chips 300 are stacked in the cavity C of the heat dissipation member 200. The second semiconductor chips 300 are electrically connected with one another, for example, by way of through electrodes 310 and are electrically connected with the first semiconductor chip 100. An underfill member 230 is formed to fill spaces between the TIM 220 and the second semiconductor chips 300 and between the stacked second semiconductor chips 300.

An encapsulation member 160 is formed to seal the upper surface of the substrate 150 including the second semiconductor chips 300, the heat dissipation member 200, and the first semiconductor chip 100, and external mounting members 170 are formed on the lower surface of the substrate 150.

In the third embodiment of the present invention, due to the fact that the metal pillars 210 are installed on both sides of the cavity C to substantially contact portions of the first semiconductor chip 100, heat can be easily dissipated from the first semiconductor chip 100 and the overall height of the semiconductor package can be decreased.

Figure 5:
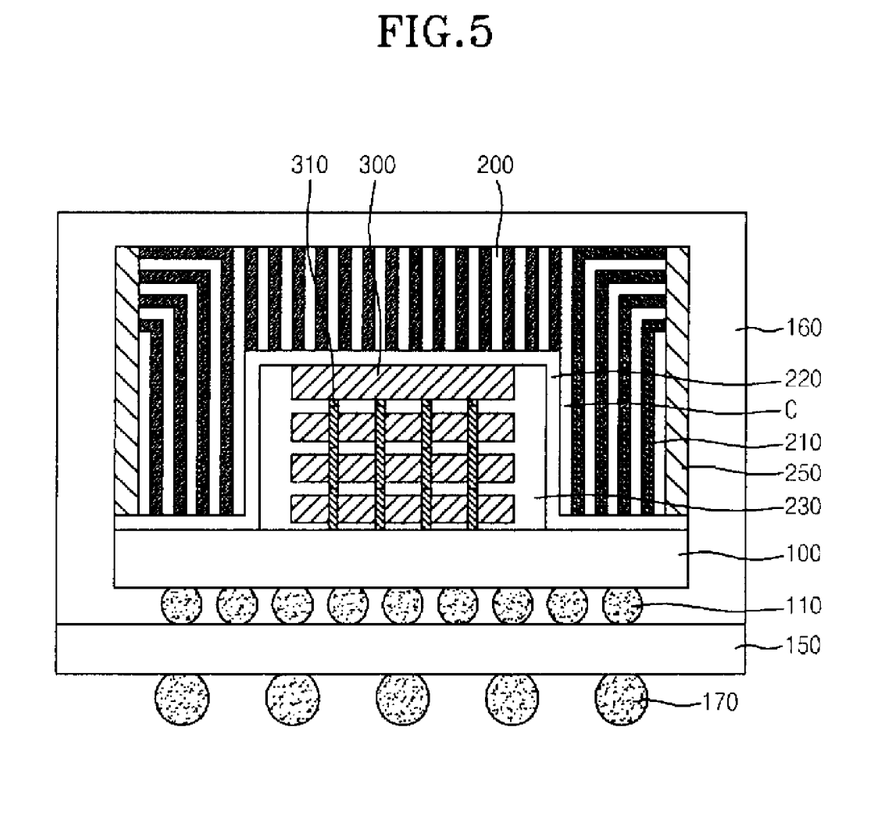
FIG. 5 is a cross-sectional view illustrating a semiconductor package in accordance with a fourth embodiment of the present invention.

FIG. 5 is a cross-sectional view illustrating a semiconductor package in accordance with a fourth embodiment of the present invention.

Referring to FIG. 5, one or more of metal pillars 210 which are installed in a heat dissipation member 200 are bent toward the sides of the heat dissipation member 200. By this fact, the heat generated during operation of the first semiconductor chip 100 can be dissipated toward both sides of the heat dissipation member 200.

Also, in the fourth embodiment of the present invention, in order to ensure that heat dissipation can be effectively implemented toward both sides of the heat dissipation member 200, metal layer patterns 250 may be formed on the side surfaces of the heat dissipation member 200 in such a way as to contact the metal pillars 210.

Similarly as explained above with respect to FIG. 1, various embodiments of the invention may allow the metal pillars the metal pillars 210 may be bent in the other two directions as well, if there is room for the metal pillars 210 around the cavity C. And, the metal layer patterns 250 may be formed on the other two sides of the cavity C.

Figure 6:
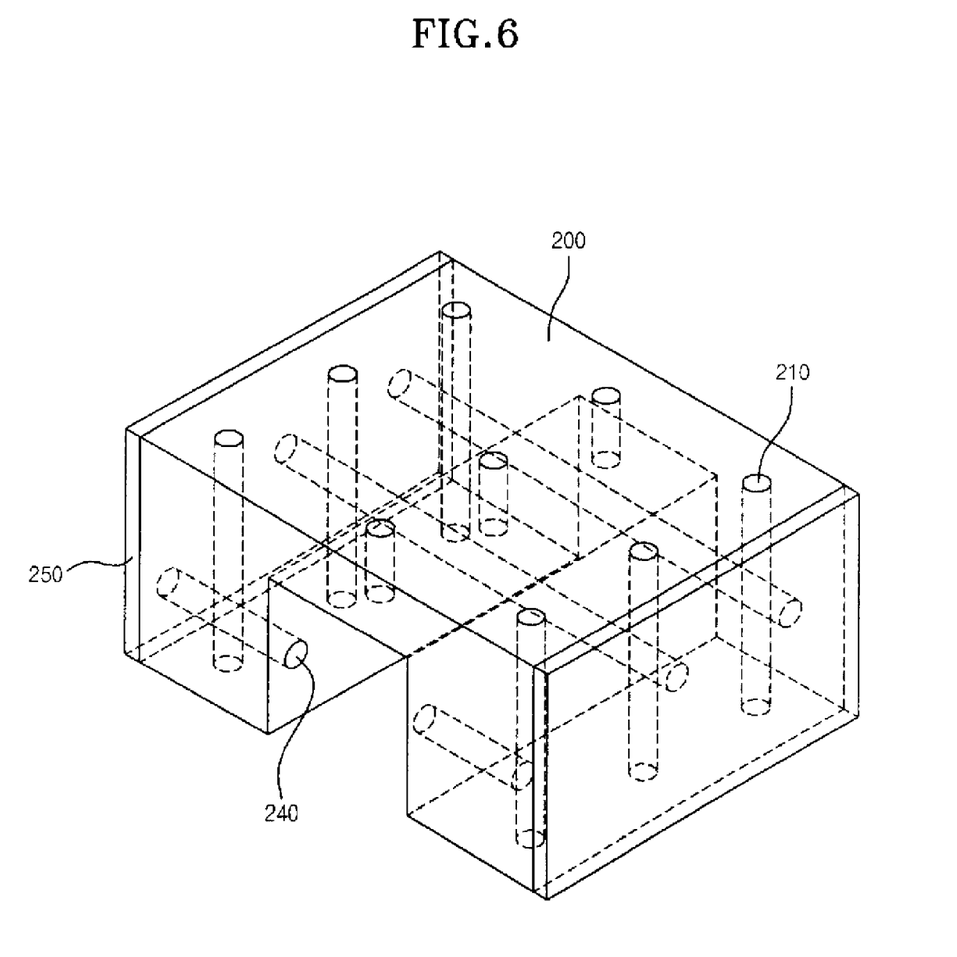
FIG. 6 is a cross-sectional view illustrating a semiconductor package in accordance with a fifth embodiment of the present invention.

FIG. 6 is a cross-sectional view illustrating a semiconductor package in accordance with a fifth embodiment of the present invention.

Referring to FIG. 6, a plurality of metal line patterns 240 are installed in a heat dissipation member 200 in such a way as to be disposed between a plurality of metal pillars 210. The metal line patterns 240 extend in a direction perpendicular to the metal pillars 210. By this fact, the heat generated during operation of the first semiconductor chip 100 can be dissipated to the sides of the heat dissipation member 200 through the metal line patterns 240.

Moreover, in the fifth embodiment of the present invention, in order to ensure that heat dissipation to the sides of the heat dissipation member 200 is more effectively implemented, metal layer patterns 250 may be formed on the side surfaces of the heat dissipation member 200 in such a way as to contact the metal line patterns 240.

Figure 7:
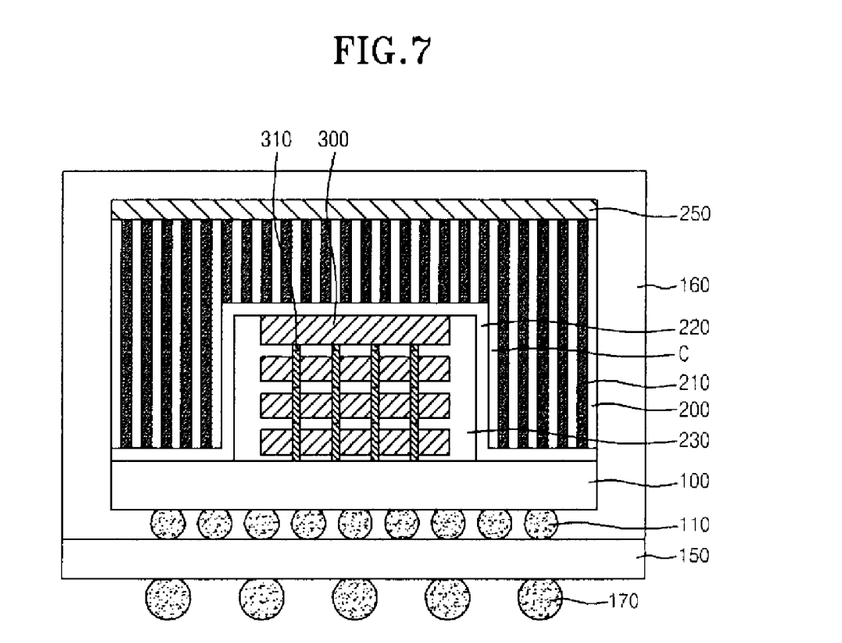
FIG. 7 is a cross-sectional view illustrating a semiconductor package in accordance with a sixth embodiment of the present invention.

FIG. 7 is a cross-sectional view illustrating a semiconductor package in accordance with a sixth embodiment of the present invention.

Referring to FIG. 7, a plurality of metal pillars 210 are installed on both sides of a cavity C of a heat dissipation member 200, and metal pillars 210 are additionally installed over the cavity C in the heat dissipation member 200. A metal layer pattern 250 is formed on the upper surface of the heat dissipation member 200 in such a way as to contact the metal pillars 210 which are installed on both sides of and over the cavity C. By this fact, heat dissipation to the upper surface of the heat dissipation member 200 can be effectively implemented through the metal layer pattern 250.

Figure 8:
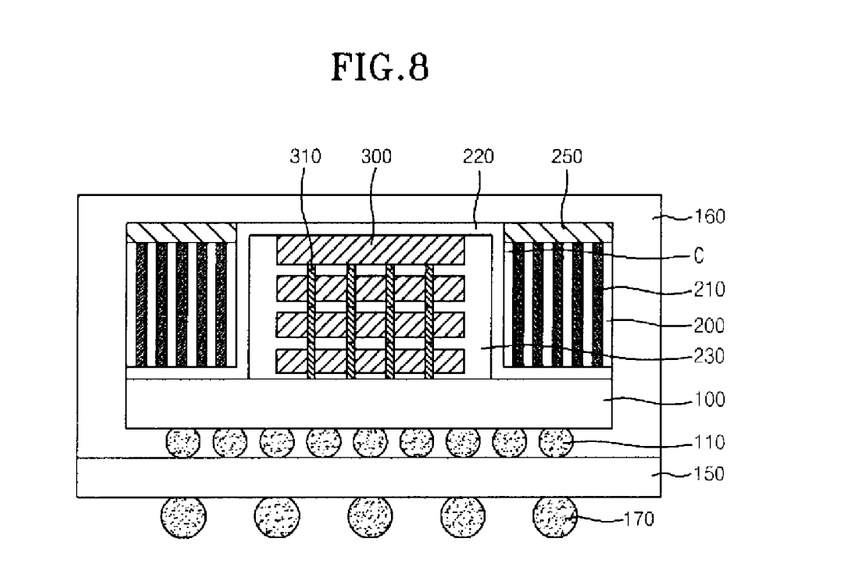
FIG. 8 is a cross-sectional view illustrating a semiconductor package in accordance with a seventh embodiment of the present invention.

FIG. 8 is a cross-sectional view illustrating a semiconductor package in accordance with a seventh embodiment of the present invention.

Referring to FIG. 8, a plurality of metal pillars 210 are installed only on both sides of a cavity C of a heat dissipation member 200. Further, metal layer patterns 250 are formed on the upper surfaces of the portions of the heat dissipation member 200 in which the metal pillars 210 are installed. By this fact, heat dissipation to the upper surface of the heat dissipation member 200 can be more effectively implemented through the metal layer patterns 250.

Figure 9:
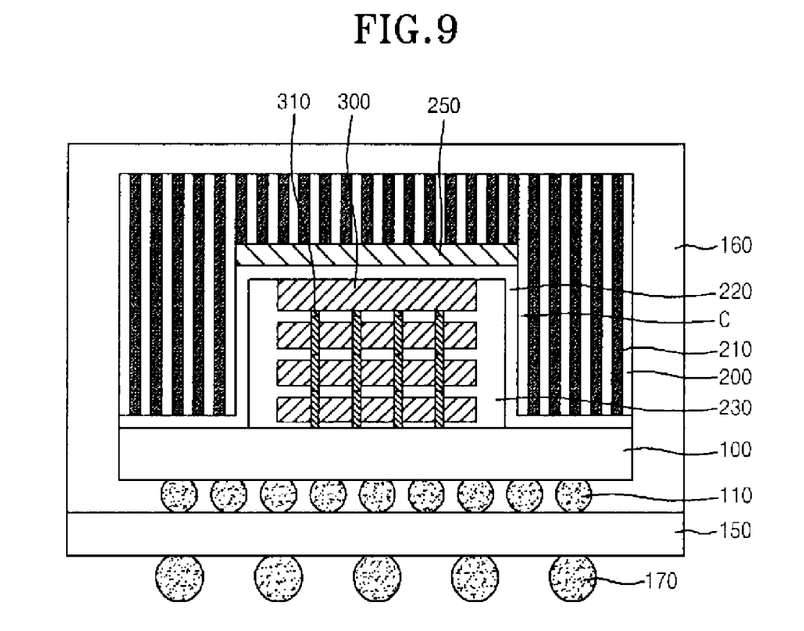
FIG. 9 is a cross-sectional view illustrating a semiconductor package in accordance with an eighth embodiment of the present invention.

FIG. 9 is a cross-sectional view illustrating a semiconductor package in accordance with an eighth embodiment of the present invention.

Referring to FIG. 9, a heat dissipation member 200 with a cavity C is disposed on a first semiconductor chip 100, and second semiconductor chips 300 are stacked in the cavity C. A plurality of metal pillars 210 are installed on both sides of the cavity C of the heat dissipation member 200, and a plurality of metal pillars 210 are additionally installed over the cavity C in the heat dissipation member 200. Furthermore, a metal layer pattern 250 is formed in such a way as to contact the metal pillars 210 which are additionally installed over the cavity C. By this fact, the heat generated during operations of the second semiconductor chips 300 can be effectively dissipated through the metal layer pattern 250.

Figure 10:
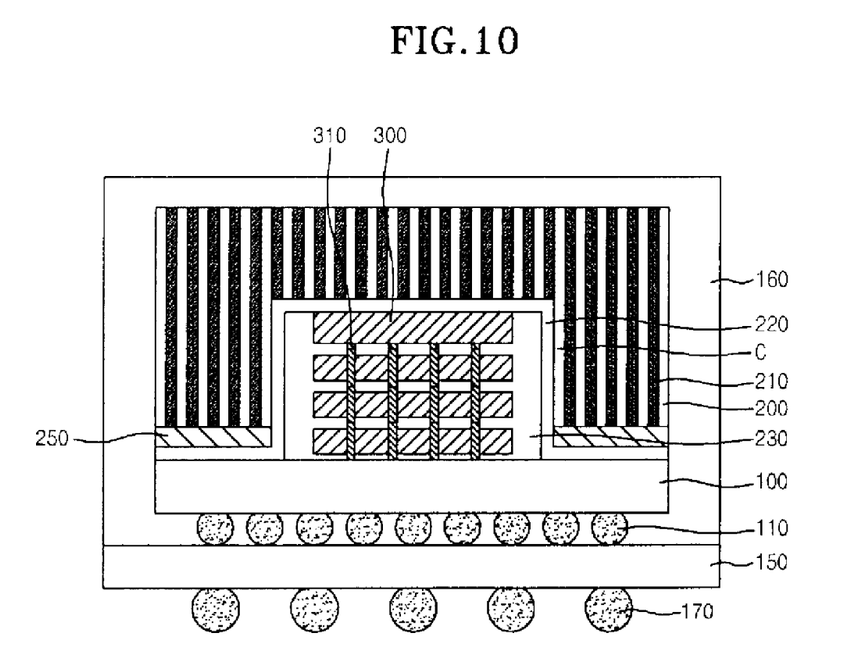
FIG. 10 is a cross-sectional view illustrating a semiconductor package in accordance with a ninth embodiment of the present invention.

FIG. 10 is a cross-sectional view illustrating a semiconductor package in accordance with a ninth embodiment of the present invention.

Referring to FIG. 10, a heat dissipation member 200 with a cavity C is disposed on a first semiconductor chip 100. A plurality of metal pillars 210 are installed on both sides of the cavity C of the heat dissipation member 200, and a plurality of metal pillars 210 are additionally installed over the cavity C in the heat dissipation member 200. Metal layer patterns 250 are formed over the portions of the first semiconductor chip 100 which substantially contact the metal pillars 210 installed on both sides of the cavity C. By this fact, the heat generated during operation of the first semiconductor chip 100 can be effectively dissipated through the metal layer patterns 250.

Meanwhile, although not shown in a drawing, the aforementioned embodiments of the present invention can be applied in a combined manner, and in this case, the heat generated during the operation of the first semiconductor chip 100 and the second semiconductor chips 300 can be more effectively dissipated.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
a first semiconductor chip having a first surface and a second surface which faces away from the first surface;
a heat dissipation member, defined with a cavity, disposed on the first surface of the first semiconductor chip and having a plurality of metal pillars which contact the first semiconductor chip; and
one or more second semiconductor chips stacked on the first surface of the first semiconductor chip in the cavity electrically connected with one another and with the first semiconductor chip.

2. The semiconductor package according to claim 1, wherein the first semiconductor chip is one of: a logic chip and a memory chip.

3. The semiconductor package according to claim 1, wherein the heat dissipation member is formed of a ceramic material.

4. The semiconductor package according to claim 1, wherein the metal pillars are formed of any one of: copper (Cu), gold (Au), aluminum (Al), and silver (Ag), or an alloy including at least one thereof.

5. The semiconductor package according to claim 1, wherein at least one of the plurality of metal pillars is bent toward a side surface of the heat dissipation member.

6. The semiconductor package according to claim 5, further comprising:
a metal layer pattern formed on the side surface of the heat dissipation member to contact the bent metal pillar.

7. The semiconductor package according to claim 1, further comprising:
metal line patterns installed in the heat dissipation member and extending among the plurality of metal pillars in a direction perpendicular to the metal pillars.

8. The semiconductor package according to claim 7, further comprising:
a metal layer pattern formed on the side surface of the heat dissipation member in such a way as to contact the metal line patterns.

9. The semiconductor package according to claim 1, further comprising:
a metal layer pattern formed on an upper surface of the heat dissipation member in such a way as to contact the metal pillars.

10. The semiconductor package according to claim 1, further comprising:
a plurality of additional metal pillars installed in the heat dissipation member over the cavity.

11. The semiconductor package according to claim 10, further comprising:
a metal layer pattern formed on the upper surface of the heat dissipation member in such a way as to contact the additional metal pillars.

12. The semiconductor package according to claim 10, further comprising:
a metal layer pattern formed in the heat dissipation member over the cavity in such a way as to contact the additional metal pillars.

13. The semiconductor package according to claim 1, further comprising:
a metal layer pattern formed over the first semiconductor chip in such a way as to contact the metal pillars.

14. The semiconductor package according to claim 1, further comprising:
a TIM (thermal interface material) formed on a surface portion of the heat dissipation member over the cavity.

15. The semiconductor package according to claim 1, further comprising:
a TIM formed on at least a portion of the first surface of the first semiconductor chip.

16. The semiconductor package according to claim 1, further comprising:
a substrate having an upper surface and a lower surface, the first semiconductor chip including the heat dissipation member and the second semiconductor chips being mounted to the upper surface of the substrate; and
external mounting members attached to the lower surface of the substrate.

17. The semiconductor package according to claim 16, further comprising:
an encapsulation member sealing the upper surface of the substrate including the heat dissipation member and the first semiconductor chip.

18. The semiconductor package according to claim 16, further comprising:
connection members interposed between the upper surface of the substrate and the first semiconductor chip.

19. The semiconductor package according to claim 1, further comprising:
pads disposed on the second surface of the first semiconductor chip;
redistribution lines formed to be connected with the pads; and
external connection terminals attached to the redistribution lines.

20. The semiconductor package according to claim 19, further comprising:
an insulation layer formed on the second surface of the first semiconductor chip in such a way as to expose at least portions of the redistribution lines.

* * * * *